(12) United States Patent
Powell

(10) Patent No.: US 11,284,522 B2
(45) Date of Patent: Mar. 22, 2022

(54) ELECTRONIC ASSEMBLY FOR A VEHICLE DISPLAY

(71) Applicant: Polaris Industries Inc., Medina, MN (US)

(72) Inventor: Mark A. Powell, Camas, WA (US)

(73) Assignee: POLARIS INDUSTRIES INC., Medina, MN (US)

( * ) Notice: Subject to any disclaimer, the term of this patent is extended or adjusted under 35 U.S.C. 154(b) by 176 days.

(21) Appl. No.: 16/784,883

(22) Filed: Feb. 7, 2020

(65) Prior Publication Data
US 2021/0251089 A1    Aug. 12, 2021

(51) Int. Cl.
| | |
|---|---|
| *H05K 5/00* | (2006.01) |
| *H05K 1/14* | (2006.01) |
| *H05K 7/20* | (2006.01) |
| *H01Q 1/52* | (2006.01) |
| *H05K 3/36* | (2006.01) |

(Continued)

(52) U.S. Cl.
CPC ............ *H05K 5/0017* (2013.01); *B62J 50/22* (2020.02); *H01Q 1/3233* (2013.01); *H01Q 1/526* (2013.01); *H05K 1/144* (2013.01); *H05K 3/368* (2013.01); *H05K 5/0008* (2013.01); *H05K 7/20436* (2013.01); *H05K 2201/10371* (2013.01); *H05K 2201/10409* (2013.01); *H05K 2201/2018* (2013.01); *H05K 2201/2036* (2013.01)

(58) Field of Classification Search
CPC ... H05K 2201/042; H05K 2201/09027; H05K 1/144; H05K 5/0017; H05K 7/142; H05K 3/368; H05K 5/0008; H05K 7/20436; H05K 2201/10371; H05K 2201/10409; H05K 2201/2018; H05K 2201/2036; H05K 3/306; H05K 1/141; B62J 50/22; H01Q 1/3233; H01Q 1/526
See application file for complete search history.

(56) References Cited

U.S. PATENT DOCUMENTS

| | | | |
|---|---|---|---|
| 1,011,574 A | 12/1911 | Carron | |
| 3,596,140 A * | 7/1971 | Walsh | .................. H05K 7/1434 361/784 |

(Continued)

OTHER PUBLICATIONS

International Search Report and Written Opinion dated Jun. 25, 2021 in corresponding PCT Application No. PCT/US2021/016905.

*Primary Examiner* — Michael A Matey
(74) *Attorney, Agent, or Firm* — Harness, Dickey & Pierce, P.L.C.

(57) ABSTRACT

An electronic assembly includes a plurality of circuit boards each comprising engagement grooves spaced around an outer wall. The assembly includes a plurality of spacers with alignment elements. The alignment elements comprise a first tab and a first tab receiver extending in a first axial direction. The alignment elements further comprising a second tab extending in a second axial direction opposite the first and a second tab receiver extending in the second axial direction. A first spacer is disposed between a first circuit board and a second circuit board. The first tab of the first spacer is disposed within a first engagement groove of the first circuit board. The second circuit board is disposed between the first spacer and a second spacer. A second tab of the first spacer is received in a second engagement groove of the second circuit board and a first tab receiver of the second spacer.

12 Claims, 13 Drawing Sheets

(51) Int. Cl.
*B62J 50/22* (2020.01)
*H01Q 1/32* (2006.01)

(56) References Cited

U.S. PATENT DOCUMENTS

| | | | | |
|---|---|---|---|---|
| 4,888,663 | A * | 12/1989 | Longerich | G02B 6/001 361/699 |
| 4,903,603 | A * | 2/1990 | Longerich | H05K 1/144 102/293 |
| 4,922,381 | A * | 5/1990 | Longerich | G02B 6/001 102/293 |
| 5,051,097 | A * | 9/1991 | Miles | H01R 12/523 439/75 |
| 5,334,029 | A * | 8/1994 | Akkapeddi | H01R 12/52 439/66 |
| 5,499,164 | A * | 3/1996 | Hill-Lindsay | H05K 7/1434 361/785 |
| 5,841,638 | A * | 11/1998 | Purdom | H05K 7/142 361/790 |
| 5,911,583 | A * | 6/1999 | Roybal | H05K 3/4015 439/66 |
| 5,969,953 | A | 10/1999 | Purdom et al. | |
| 6,351,383 | B1 * | 2/2002 | Payton | F42B 15/08 165/80.3 |
| 6,386,913 | B1 * | 5/2002 | Mohammad | H01R 24/50 439/579 |
| 7,215,557 | B2 * | 5/2007 | Glovatsky | H05K 1/144 361/748 |
| 8,942,005 | B2 * | 1/2015 | Geswender | F42C 19/06 361/792 |
| 9,357,663 | B2 * | 5/2016 | Haaf | H05K 5/0239 |
| 9,472,887 | B1 * | 10/2016 | Horning | H01R 12/7082 |
| 9,814,128 | B1 * | 11/2017 | Wynar | H05K 1/02 |
| 10,448,503 | B1 * | 10/2019 | Emerson | F21V 19/004 |
| 2002/0053723 | A1 * | 5/2002 | Matsuura | H01L 23/13 257/678 |
| 2002/0176233 | A1 * | 11/2002 | Evans | H01R 12/523 361/735 |
| 2006/0219686 | A1 | 10/2006 | Oishi et al. | |
| 2008/0105963 | A1 * | 5/2008 | Carlson | H05K 1/144 257/686 |
| 2008/0304241 | A1 * | 12/2008 | Pasveer | H05K 1/0284 361/735 |
| 2009/0242539 | A1 | 10/2009 | Wassel | |
| 2014/0233189 | A1 * | 8/2014 | Shin | H05K 3/202 361/720 |
| 2014/0327320 | A1 | 11/2014 | Muhs et al. | |
| 2017/0094727 | A1 | 3/2017 | Saunamaki | |
| 2017/0094792 | A1 * | 3/2017 | Dunkel | H05K 1/144 |
| 2017/0257967 | A1 * | 9/2017 | Obrist | H02G 3/12 |
| 2018/0216780 | A1 | 8/2018 | Oilmans | |
| 2018/0242469 | A1 | 8/2018 | Suzuki | |
| 2021/0085163 | A1 * | 3/2021 | Chen | H05K 1/147 |

* cited by examiner

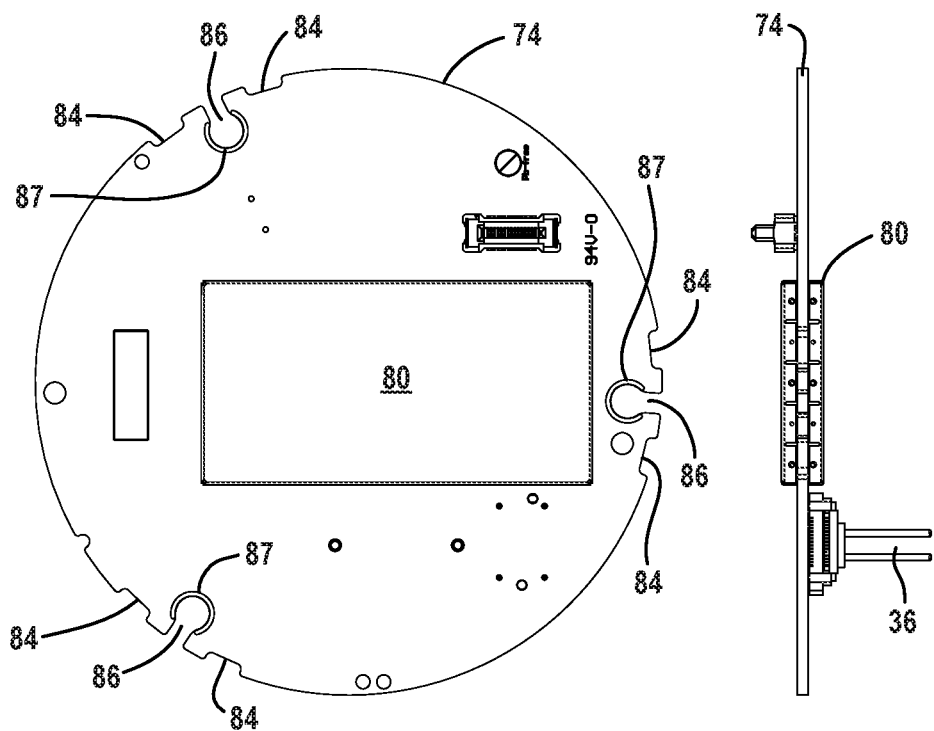
FIG. 4A
FIG. 4B
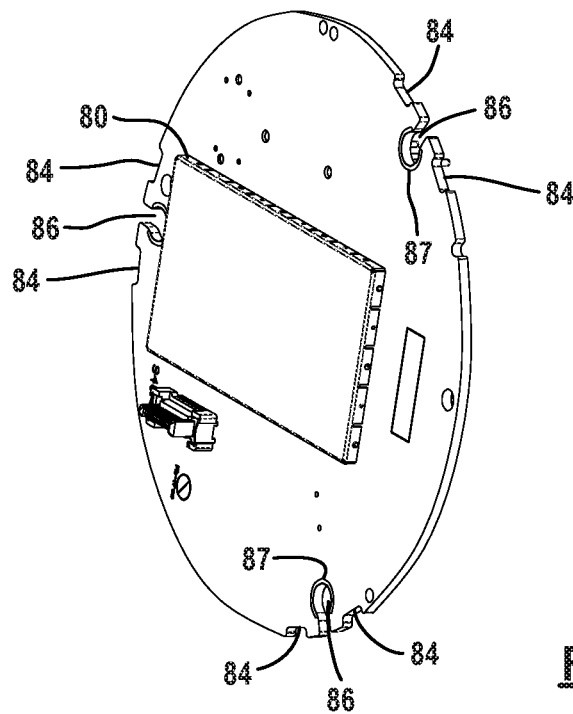
FIG. 4C

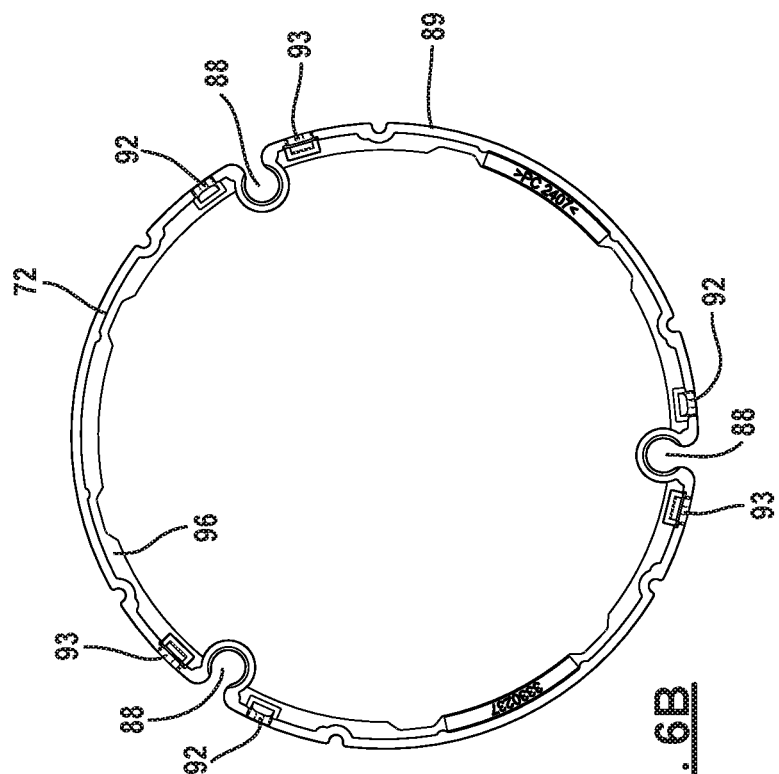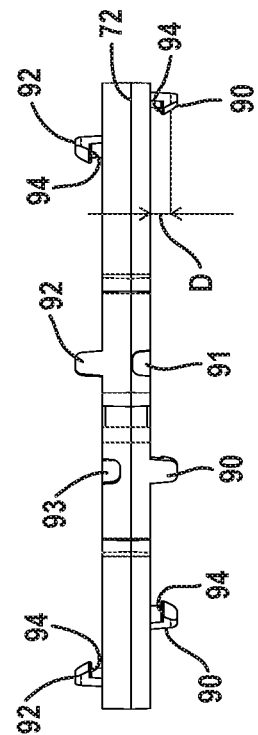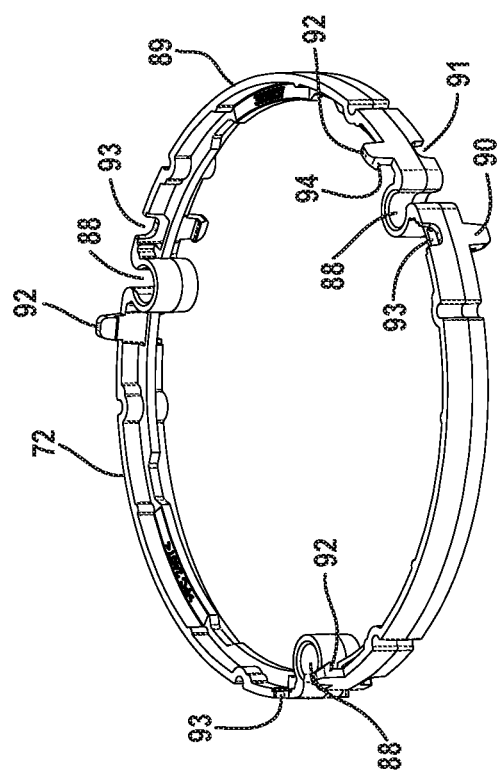
FIG. 6B
FIG. 6C
FIG. 6A

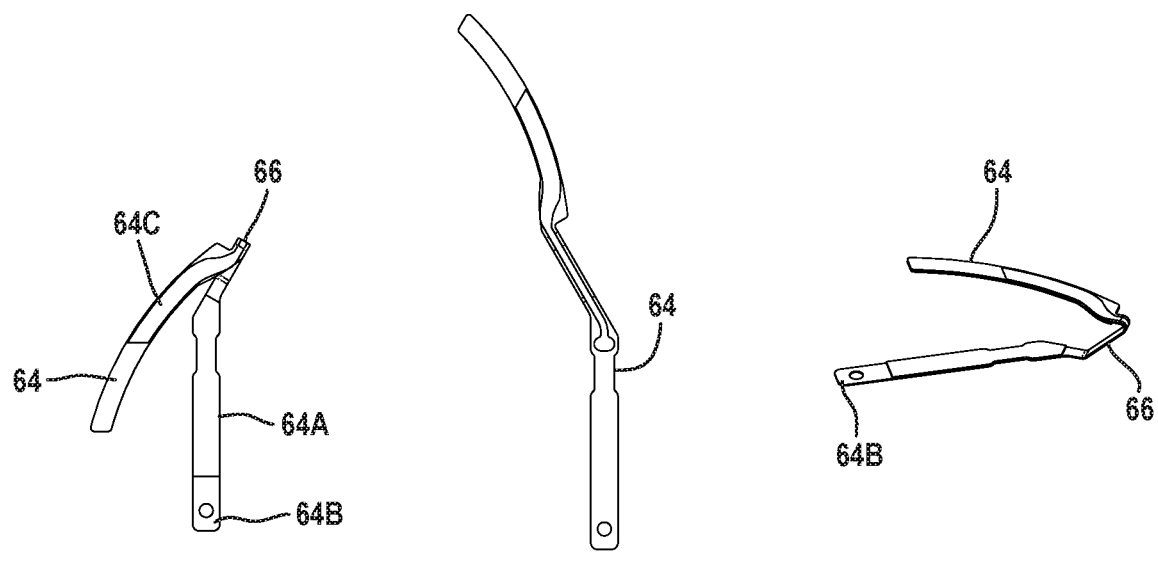

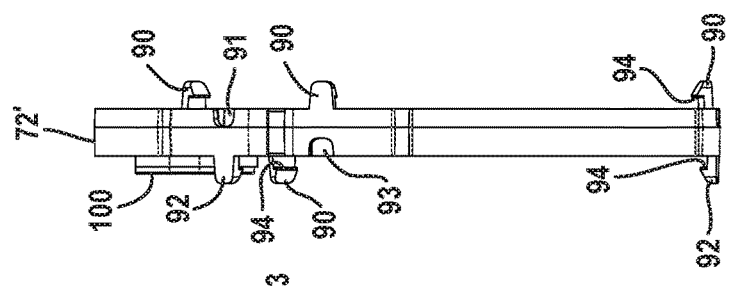
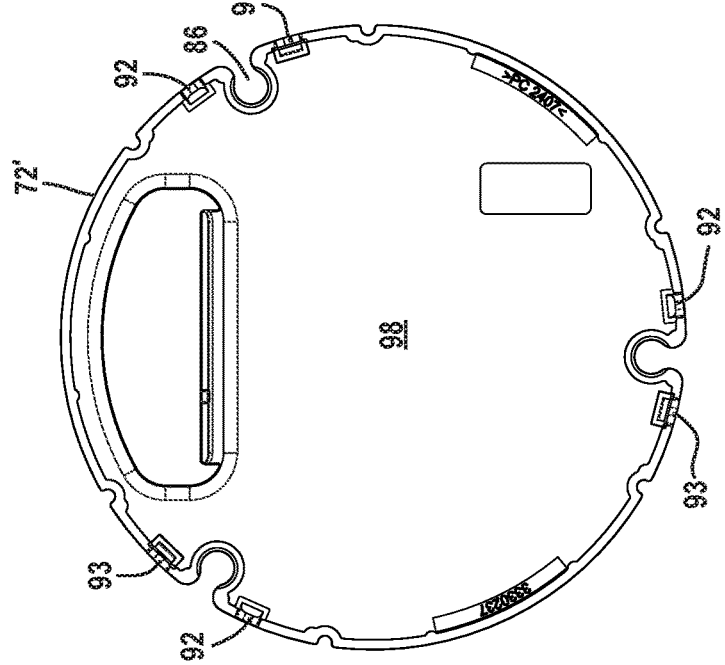
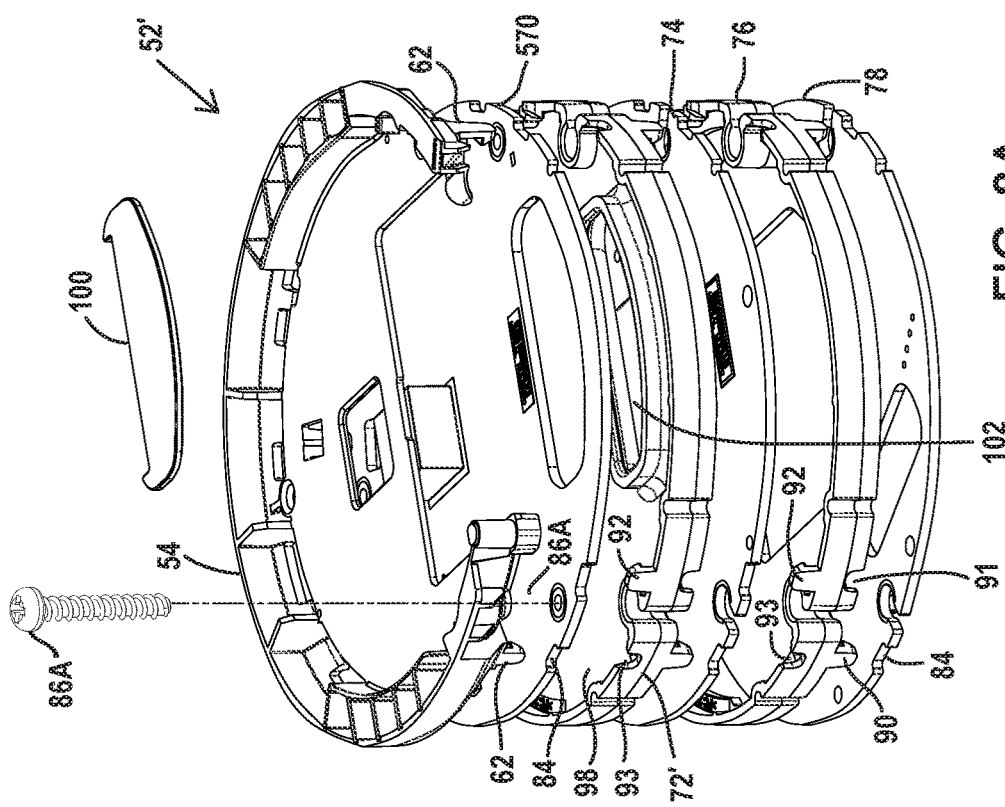

ELECTRONIC ASSEMBLY FOR A VEHICLE DISPLAY

FIELD

The present disclosure relates to a display for a vehicle and, more particularly, to an electronic assembly for stand-alone display configuration.

BACKGROUND

This section provides background information related to the present disclosure which is not necessarily prior art.

Vehicle displays for open air vehicles such as motorcycles are often relatively simple due to their relatively small area to which a display can be mounted. Many motorcycles have retro styling and therefore a simple shaped display conforms to the retro styling.

In automotive applications functions, such as navigation with global positioning and other functions, are often incorporated into an instrument cluster. Proving additional functions into a package suitable for the styling presents a challenge.

SUMMARY

This section provides a general summary of the disclosure, and is not a comprehensive disclosure of its full scope or all of its features.

The present disclosure provides an improved display that provides increased functions. While the system is suitable for various types of automotive vehicles, the configuration set forth herein provides a configuration particularly suitable for motorcycles and open air vehicles.

In one aspect of the disclosure, an electronic assembly includes a plurality of circuit boards. Each of the plurality of circuit boards comprises a first plurality of pairs of engagement grooves spaced around an outer wall of the first circuit board. The pair of engagement grooves comprise first grooves and second grooves. The plurality of circuit boards comprise a first circuit board and a second circuit board. The assembly also includes a plurality of spacers. Each of the plurality of spacers comprises a plurality of sets of alignment elements. Each set of alignment elements comprise a first tab extending in a first axial direction and a first tab receiver extending in the first axial direction having a first size for receiving a first portion of the first tab. The plurality of sets of alignment elements further comprising a second tab extending in a second axial direction opposite the first axial direction and a second tab receiver extending in the second axial direction having a second size for receiving a second portion of the second tab. The plurality of spacers comprising a first spacer and a second spacer. The first spacer is disposed between the first circuit board and second circuit board. The first tab of the first spacer is disposed within a first engagement groove of the pairs of engagement grooves of the first circuit board. The second circuit board is disposed between the first spacer and a second spacer of the plurality of spacers. A second tab of the first spacer is received in a second engagement groove of the pairs of engagement grooves of the second circuit board and a first tab receiver of the second spacer. A third tab of the second spacer is received in a third engagement groove of the second circuit board and is at least partially within a second tab receiver of the first spacer.

In another aspect of the disclosure, a heat transfer assembly for a plurality of circuit boards disposed in a housing and has a first electronic element disposed on a circuit board disposed on a first plane and a second circuit board spaced apart from the first circuit board and disposed in a second plane. The second circuit board comprises an opening axially aligned the first electronic element. A flexible heat transfer element is disposed adjacent to a bottom surface of the housing, said flexible heat transfer element comprising a tab portion extending therefrom. The tab portion has a central portion disposed against the first electronic element forming a third plane between the first plane and the second plane, and an end portion extending between the second plane and the housing so that heat conduct through the flexible heat transfer element to the housing.

In yet another aspect of the disclosure, a method for assembling an electronic assembly includes stacking and joining a plurality of circuit boards and spacers alternately, inserting a flexible heat transfer element into a housing adjacent to a bottom wall, bending a bending portion of a tab portion of the flexible heat transfer element so that a central portion of the tab portion contacts an electronic component within the stack and disposing an end portion toward the housing so that an opening with the end portion is around a connector.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected examples and not all possible implementations, and are not intended to limit the scope of the present disclosure.

FIG. 4A is a top view of the circuit board 74.

FIG. 4B is a side view of the circuit board 74.

FIG. 4C is a perspective of the circuit board 74.

FIG. 6A is a perspective view of a spacer.

FIG. 6B is a top view of the spacer.

FIG. 6C is a side view of the spacer.

FIG. 7A is a top view of a folded GPS antenna.

FIG. 7B is a top view of an unfolded antenna.

FIG. 7C is a perspective view of a partially folded antenna.

FIG. 8A is a partially exploded view of an alternate example of a spacer.

FIG. 8B is a top view of the alternate example of the spacer.

FIG. 8C is a side view of the spacer having an alternate configuration.

Corresponding reference numerals indicate corresponding parts throughout the several views of the drawings.

DETAILED DESCRIPTION

Example examples will now be described more fully with reference to the accompanying drawings. Although the following description includes a motorcycle application, it is understood that the features herein may be applied to any appropriate vehicle, such as but not limited to snowmobiles, all-terrain vehicles, utility vehicles, moped and scooters. The examples disclosed below are not intended to be exhaustive or to limit the invention to the precise forms disclosed in the following detailed description. Rather, the examples are chosen and described so that others skilled in the art may utilize their teachings.

The relative terms used in the present disclosure are relative to a vehicle 10 in a normal operating position. The vehicle direction in FIG. 1 has a longitudinal axis that corresponds to a normal direction of travel. Right, left, front, back, under and above all referred to relative position of the vehicle in a normal upright position on a road surface.

Figure 1:
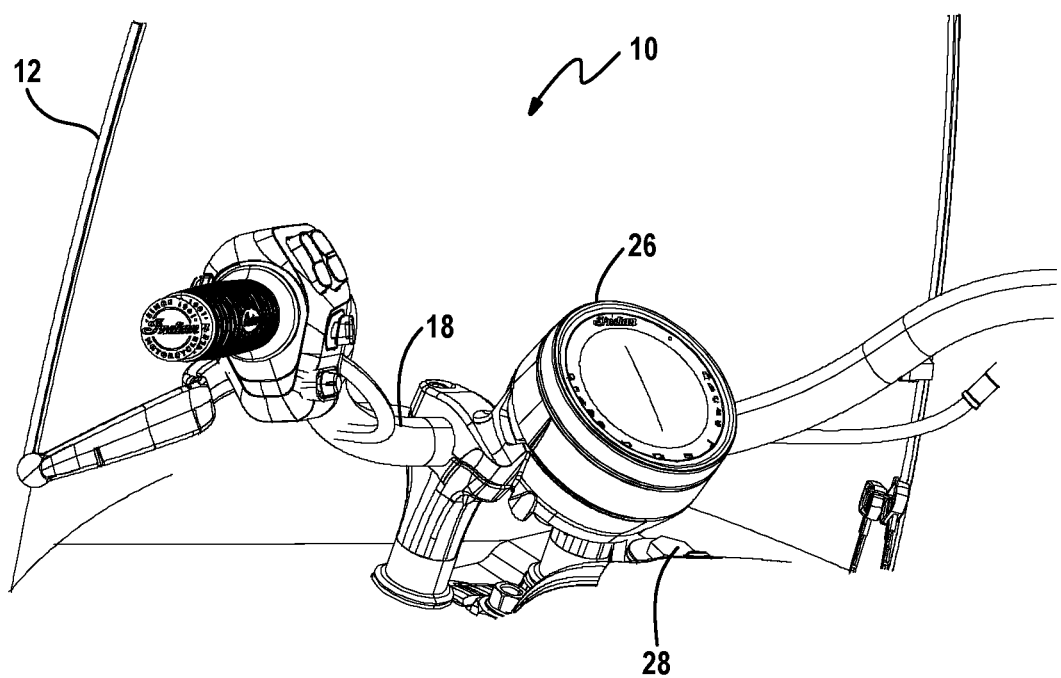
FIG. 1 is a side view of the motorcycle having the display assembly housing 26 according to the present disclosure.

Referring now to FIG. 1, a portion of a vehicle 10 is illustrated. The vehicle 10 may be a two-wheeled vehicle such as a touring style motorcycle with a windscreen 12. However, the present example is also applicable to other types of vehicles including but not limited to snowmobiles, scooters, utility vehicles, and off-road vehicles.

The vehicle 10 includes handlebars 18 for steering the front wheel of the vehicle 10. A display assembly 26 is coupled to the vehicle 10. The display assembly 26 may be coupled to the handlebars 18, a frame or at the triple clamp 28 that receives the handlebars 18.

Figure 2A:
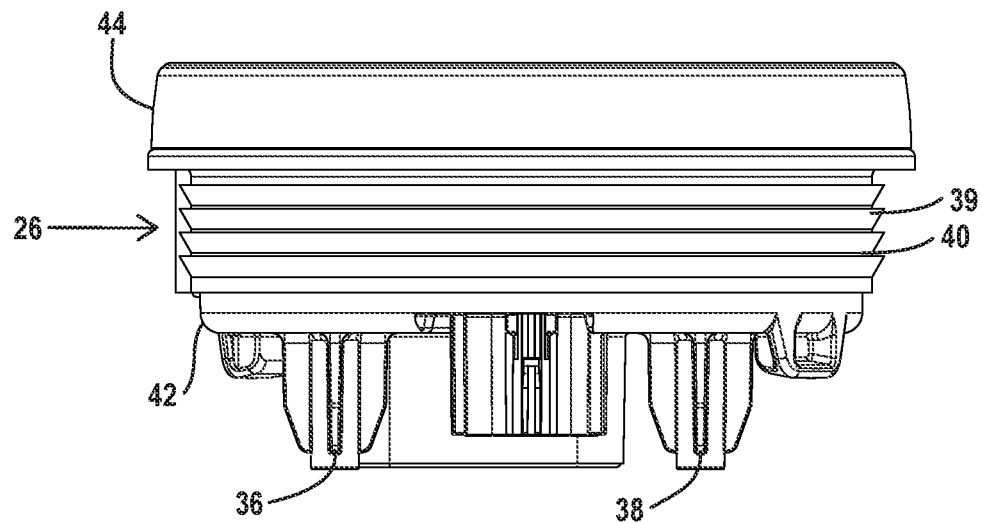
FIG. 2A is a side view of the display assembly housing of FIG. 1.

Referring now to FIG. 2A, a side view of the display assembly 26 is illustrated. In this example, a first connector 36 and a second connector 38 are set forth. A housing 39 has a side wall 40 and a bottom wall 42. A bezel 44 encloses the housing 39 by holding a cover 46 thereto. A plurality of indicators 48 may be used to provide feedback to the user with respect to various functions being performed by the vehicle. For example, a fuel level indicator, a neutral indicator, a transmission indicator, a warning indicator, a high beam indicator, a battery indicator, a key indicator, an ABS indicator and a cruise control indicator may all be provided.

The cover 46 may form part of a touch screen and touch screen buttons 50 may be formed thereon. The buttons 50 may include such functions such as a back button, a menu button, a dial button and a forward button. Of course, many other types of indicators 48 and buttons 50 may be used.

Figure 2B:
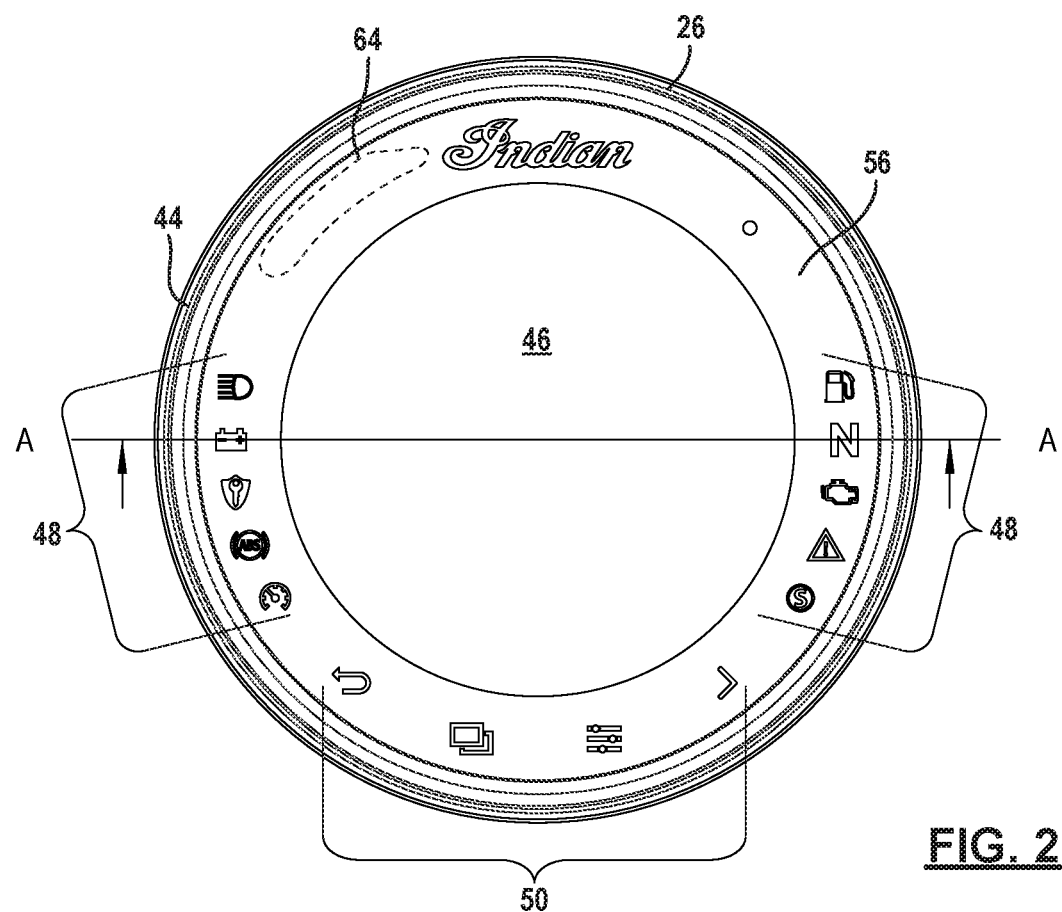
FIG. 2B is a top view of the display assembly housing of FIG. 1.

Referring now to FIGS. 3A-3E, a top view, a side view, a bottom perspective view, a top perspective view and a partially exploded view of a circuit assembly 52 that is disposed within the housing 39 illustrated above is set forth. The housing 39 is generally cylindrical and has a longitudinal axis 43. The circuit assembly 52 includes an alignment frame 54 on which a touch screen display 56 is disposed. The alignment frame 54 may perform various functions including alignment to the touch screen display 56 with the housing 39. The alignment frame 54 may also comprise light guides 58. The light guides 58 separate the individual indicator areas for the indicators 48 illustrated in FIG. 2B. The light guides 58 prevent cross illumination of the adjacent indicators from the light sources. Typically, a separate light source is provided for each of the indicators 48. The alignment frame 54 may also include reinforcements 60 that are used to support a touch screen display 56 adjacent to the buttons 50 that are displayed on the touch screen display. The reinforcements 60 provide axial reinforcement for the display and prevent the display from over flexing during operation.

An antenna 64 is disposed on the alignment frame 54. The antenna 64 is a global positioning system antenna. The antenna 64 is disposed away from the processor and other components on the circuit boards 70, 74 and 78. The antenna 64 is directly adjacent to the cover 46. The cover 46 is formed of a satellite signal transmissive material such as glass.

The circuit assembly 52 includes a first circuit board 70 on which the alignment frame 54 is attached by way of one or more tabs 62. A first spacer 72 separates the first circuit board 70 from a second circuit board 74. A second spacer 76 separates the second circuit board 74 from a third circuit board 78. Geometry of the first circuit board 70, the first spacer 72, the second circuit board 74, the second spacer 76 and the third circuit board 78 are described in more detail blow.

The spacers 72, 76 are unitary structures and are used to engage a circuit board above or below it. This will be described in more detail below.

Figure 3A:
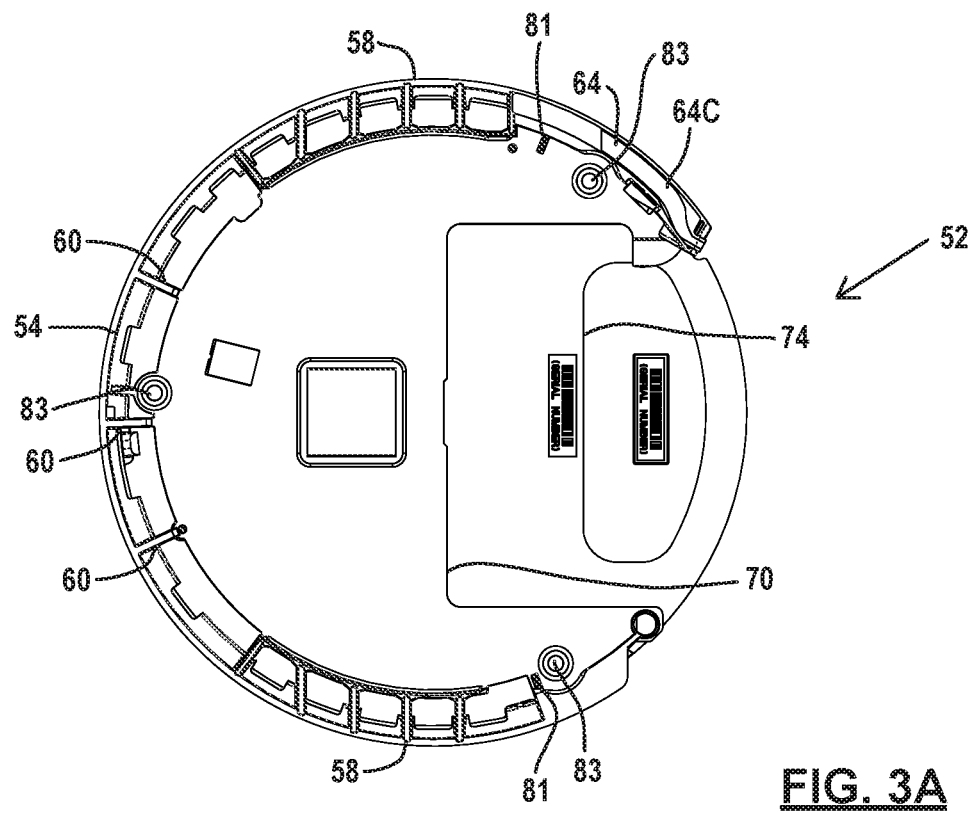
FIG. 3A is a top view of the circuit assembly of the display assembly.
Figure 3B:
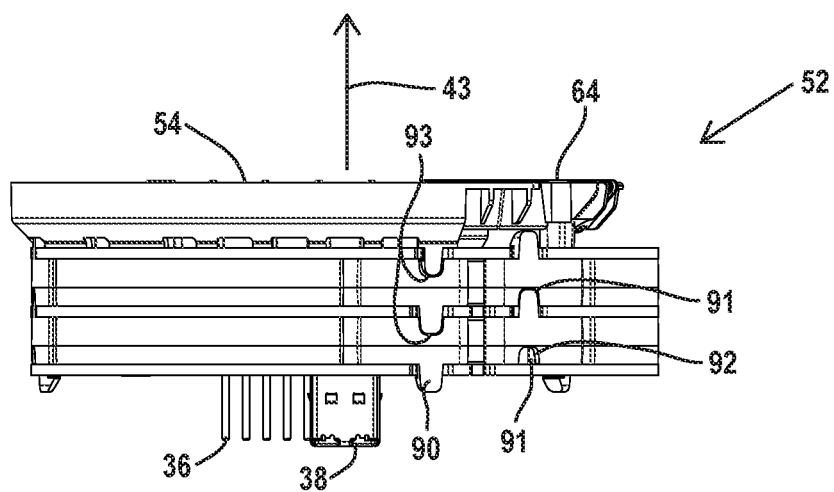
FIG. 3B is a side view of the circuit assembly.
Figure 3C:
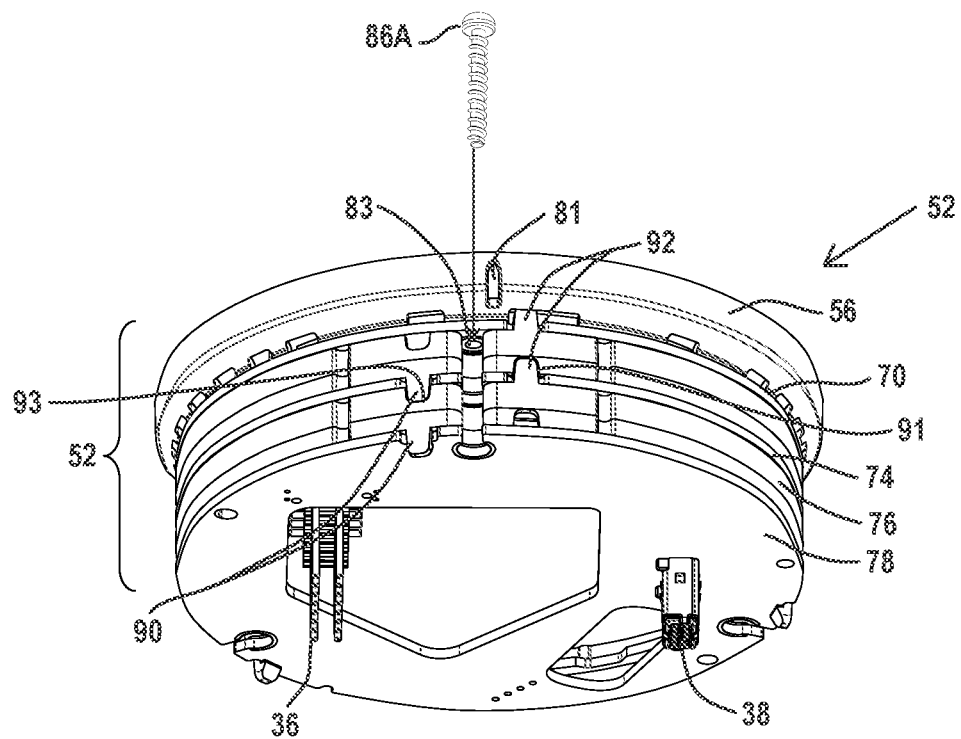
FIG. 3C is a bottom perspective view of the circuit assembly.
Figure 3D:
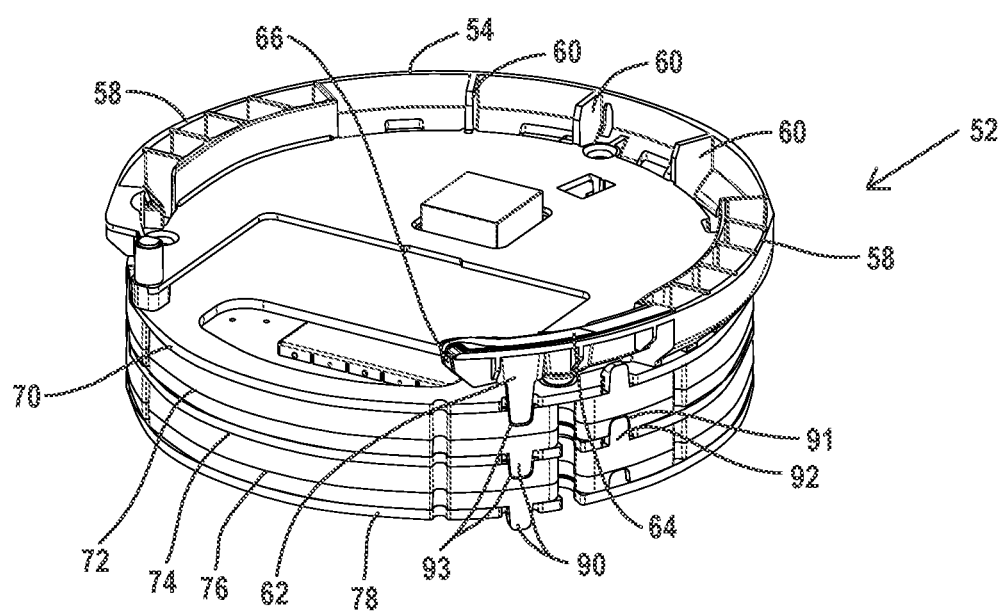
FIG. 3D is a top perspective view of the circuit assembly.
Figure 3E:
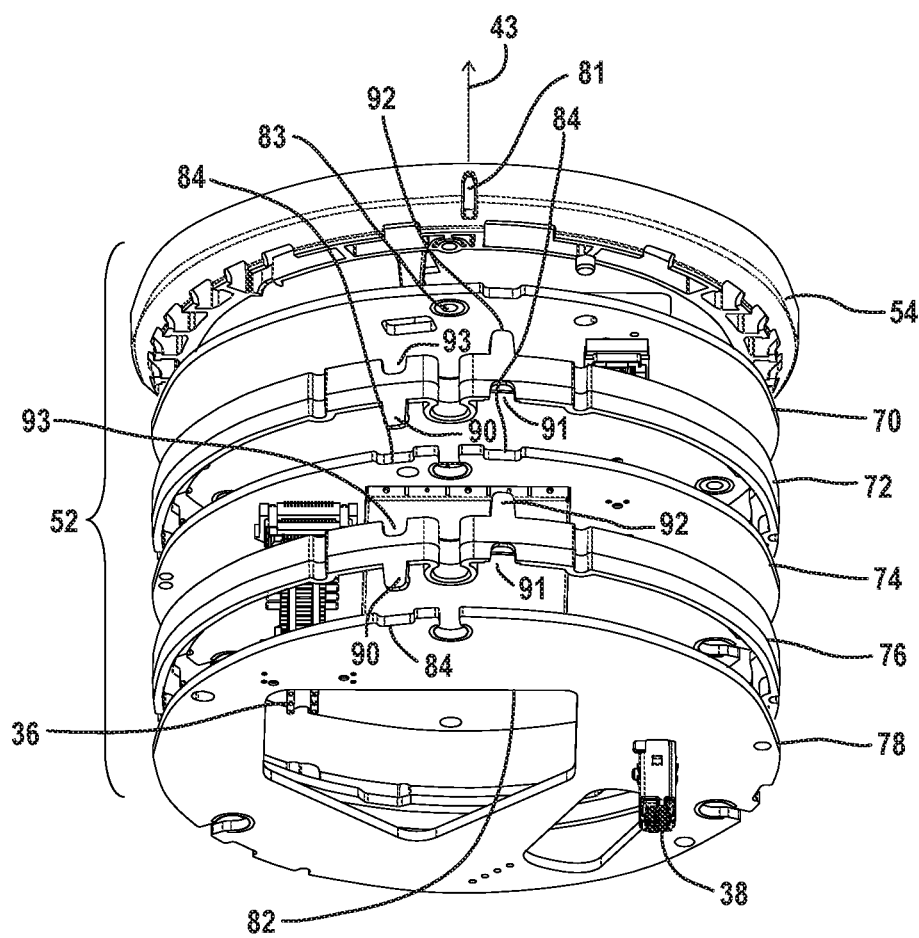
FIG. 3E is a partially exploded view of the circuit assembly.
Figure 5:
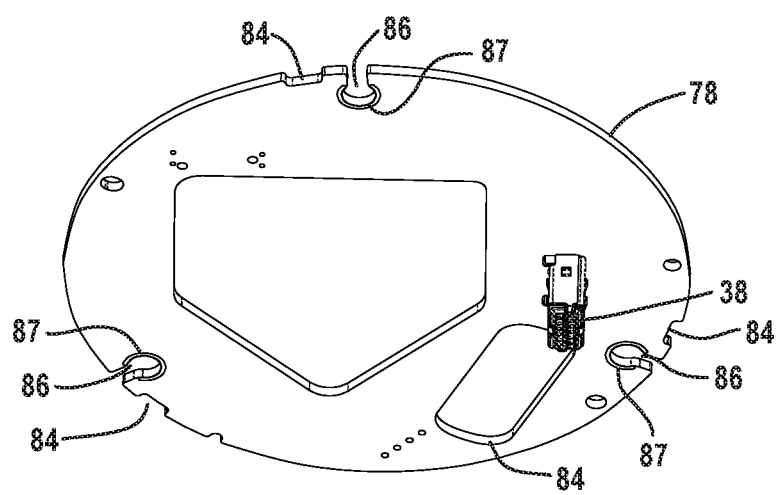
FIG. 5 is a perspective view of the circuit board 78.

Referring now to FIGS. 3A-3F and 4A-4C, a top, side and perspective view of the circuit board 74 is set forth. In this example, the circuit board 74 includes a processor 80. The processor 80 is a thermally active component and thus heat is desired to be removed therefrom as will be described in more detail below. However, the heat may be desired to be removed from various other electronic components within the circuit assembly 52. The first connector 36 originates from the circuit board 74 and extends through an opening 82 as is best illustrated in FIG. 3E.

The circuit board 74 includes engagement grooves 84. The engagement grooves 84 extend inwardly from the periphery of the circuit board 74. In this example, the circuit board 74 is round and the engagement grooves extend radially inwardly. In this example, the engagement grooves 84 are disposed in pairs and spaced evenly around the periphery of the circuit board 74. Two engagement grooves 84 are disposed relatively close together with an fastener openings 86 therebetween. In this example, the fastener openings 86 is a cut out in the circuit board and may receive a fastener for securing the circuit board assembly to the housing 39. The fastener openings 86, in this example, are generally a circle with a visual cue such as an optical guide 87 partially there around. The optical guide 87 may be silk screened art work on the surface of the circuit board.

Orientation ribs 81 are used to assist the assembler in aligning the circuit assembly 52 into the housing 39 during assembly. Fastener openings 83 receive respective fasteners 86A (only one of which is shown). One example of a suitable fastener is a threaded fastener.

Referring now to FIGS. 3A-3F and 5, the circuit board 78 is set forth. The circuit board 78 is the lowermost circuit board within the display assembly. The engagement grooves 84 may also be provided. The circuit board 78 is the lowermost circuit board in the circuit assembly 52. Because the circuit board 78 is the lowermost board, a single engagement groove 84 is illustrated at each engagement position. The engagement groove 84 aligns axially with the engagement grooves 84 illustrated within the circuit boards 70, 74. Fastener openings 86 may also be disposed on these circuit boards 78.

Referring now to FIGS. 6A-6C, a perspective, top and side view of a spacer 72 is set forth. In this example, all of the spacers 72, 76 are configured the same. The spacers 72, 76 are also bi-orientable, which means they can be used right side up and upside down since they are symmetrical. Also, the engagement grooves 84 and the fastener openings 86 align with spacer fastener openings 88 within an outer wall 89 defining the outer wall 89 of the spacer 72. The wall 89 extends axially. The spacer 72 also has alignment elements comprising a plurality of tabs 90, 92 and a plurality of tab receivers 91, 93. The plurality of tabs 90, 92 extend in opposite axial directions. Tabs 90 extend axially downward toward the bottom wall 42 when assembled. Tabs 92 extend axially upward toward the cover 46. The tabs 90, 92 have an engagement surface 94 that extends radially. The engagement surface 94 is used to engage a planar upper or lower surface of the adjacent circuit board. The distance D between the engagement surface 94 and the upper or lower edge of the remainder of the spacer 72 is sized to receive the thickness of the circuit board to which the spacer 72 is to be assembled. The spacer 72 may also include a reinforcement flange 96. The flange 96 extends around the outer wall 89 of the spacer 72 in a radial direction. The flange 96 reinforces the spacer 72 to provide rigidity thereto.

The tab receivers 91, 93 extend in an axial direction. The tab receivers 91, 93 are cutouts or recessed portions of the upper and lower (relative to assembly) of the spacer 72. The tab receiver 93 may be axially aligned with the tab 90 and extend in the same direction. The tab receiver 91 may be axially aligned with the tab 92 and extend in the same direction. The direction of alignment of the tab receiver 93 and the tab 90 may be opposite to the tab 90 and the tab receiver 91. The tab receivers 91, 93 partially receive at least a portion of the tabs 90, 92, e.g., the portion of the tab extending beyond its adjacent circuit board surface. The portion of each tab 90, 92 beyond the engagement surface of the tab 90, 92 are received at the respective tab receivers 91, 93.

Referring now to FIG. 7A-7C, the antenna 64 described above relative to FIG. 3A is set forth. The antenna 64 has a lower portion 64A that is coupled within the alignment frame 54 at 64B and is attached to the circuit board 70. The upper portion 64C is visible in FIG. 3A. A narrowed portion 66 is used for allowing the antenna 64 to move easily bend.

Referring now to FIGS. 8A-8C, an alternate example of a circuit assembly 52' is illustrated. In this example, the same reference numerals are used to represent the same components as the ones set forth above. In this example, the spacer 72' is different than the spacer 72 illustrated above. In this example, the spacer 72' is formed of an electrically shielding material such as graphite impregnated plastic. The spacer 72', instead of being open in the middle as above, has a cover 98 in the inner periphery within the outer wall 89. The cover 98 is also formed of an electrically shielding material to prevent the interference of stray RF electrical signals (EMI) from the circuit boards 74, 78 with the reception of the GPS antenna 64. To provide further isolation, a door 100 may be used. The door 100 is disposed within an opening 102 of the cover 98. The door 100 allows access to the circuits and connectors below the door 100 during assembly. The door 100 may be placed within the opening 102 after assembly. The spacer 72' may also include the other features of the previous described spacers such as the fastener openings 88, the tabs 90, 92 and tab receivers 91, 93.

Figure 9:
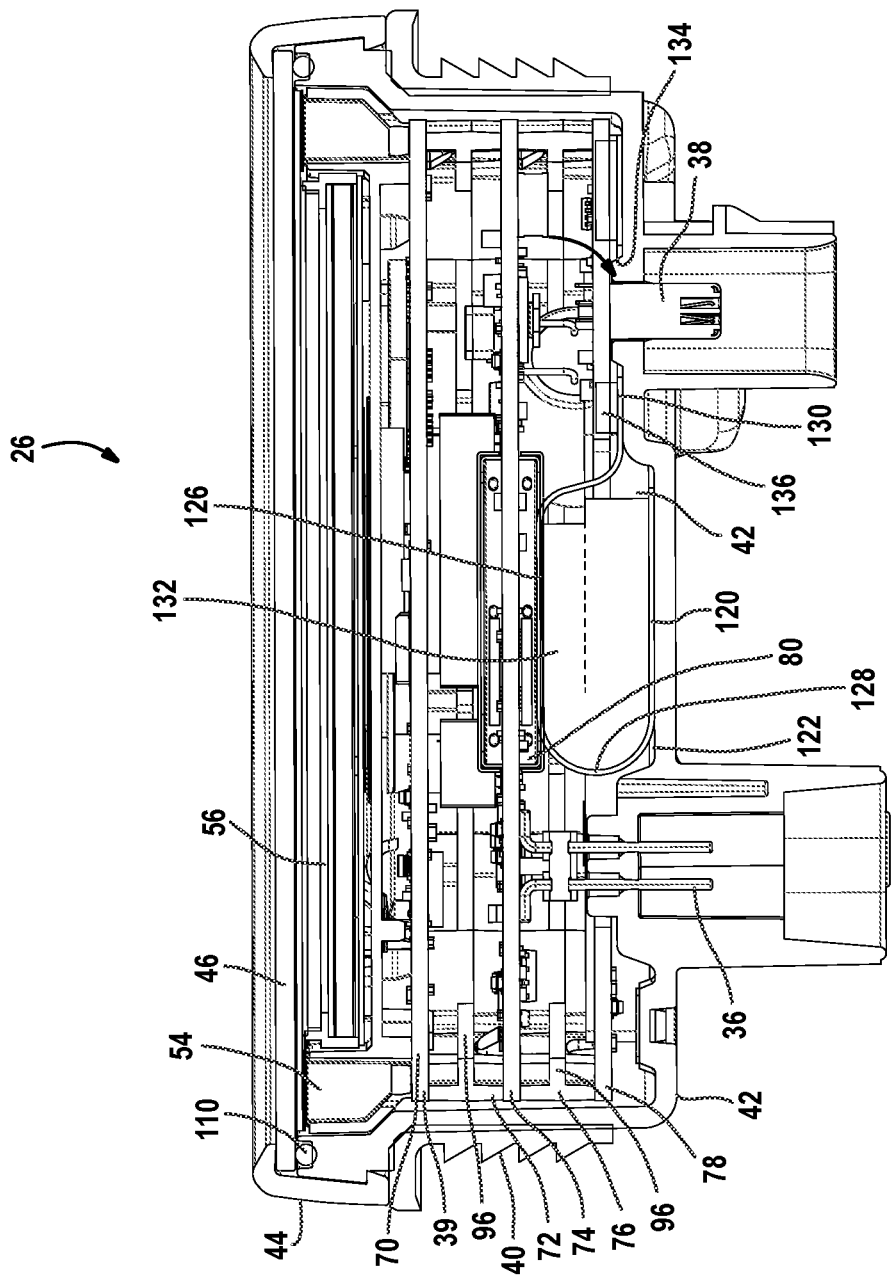
FIG. 9 is a cross-sectional view of the display assembly.

Referring now to FIG. 9, a cross-sectional view of the display assembly 26 is set forth within the housing 39. In this example, the cover 46 is illustrated coupled to the bezel 44 with a seal 110. The seal 110 may be an O-ring and may be rubberized. The touch screen display 56 is supported by the cover glass 46 and may also be supported by the alignment frame 54. The alignment frame 54 is mounted to the first circuit board 70. The first spacer 72 is shown between the first circuit board 70 and the second circuit board 74. A second spacer 76 is shown between the second circuit board 74 and the third circuit board 78. As mentioned above, the electronic components such as the processor 80 generates a lot of heat. In order to prevent premature breakdown of the circuitry and malfunctions, it is desirable to transfer the heat away from the processor 80 and distributed to the side wall 40 and bottom wall 42 of the housing 39. A flexible heat transfer element 120 may be disposed within the housing 39.

Referring now to FIG. 9, flexible heat transfer element 120 is in the assembled position and in FIGS. 10A-10F is in various positions achieved prior to and during assembling of the assembled position. The flexible heat transfer element 120 has a first portion 122 that is directly adjacent to the bottom wall 42. The first portion 122 has a generally circular shape to conform to the bottom wall 42.

The flexible heat transfer element 120 includes a tab portion 124. The tab portion 124 has a central portion 126, a bending portion 128, and an end portion 130. The bending portion 128 and the end portion 130 extend radially beyond the periphery of the first portion 122.

The first portion 122 and the central portion 126 have a conformable layer 132 such as foam. The conformable layer 132 is folded on itself so that the central portion 126 forms a generally planar portion that is planar to the circuit board 74. The conformable layer 132 supports the heat transfer element 120 to hold the form of the bend. The conformable layer 132 prevents the heat transfer element 120 from collapsing onto itself. This action forces the outer layer polymer layer 142 below) into tension and prevents the thermally conductive layer 132 from breaking. When assembled, the central portion 126 is directly adjacent to the processor. The processor 80 generates heat which is conducted away from the processor 80 toward the bottom wall 42 around the layer 132 toward the center portion of the housing 39 and to the rightmost portion of FIG. 9 toward the connector 38. An opening 134 in the end portion 130 allows the connector 38 to pass through therethrough.

A thermally conductive conformable layer 136 may also be disposed on an opposite surface of the end portion 130 that is opposite the layer 132 described above. The layer 136 may be of a reduced thickness compared to that of the layer 132. The layer 136 is placed directly adjacent to the circuit board 78 when assembled as illustrated best in FIG. 9. The layer 136 helps improve the thermal contact between the thermally conductive element and the bottom wall 42.

When the end portion 130 is completely folded during assembly, the end portion fits into a cutout 138. The cutout 138 is positioned opposite the end portion 130 prior to assembly.

The assembly of the display assembly 26 may be performed as follows. The circuit board 78 may have the second spacer 76 coupled thereto. The lower tabs 92 may engage the engagement grooves 84. The engagement surface 94 of the tab 92 fits around the edge of the circuit board to retain the circuit board to the spacer. The circuit board 74 may be coupled to the same spacer coupled to the circuit board 78. In this example, the upper tabs 90 engage the circuit boards 74 at the engagement grooves 84. During assembly, the fastener openings 86, optical guide 87 and the fastener opening 88 may be aligned because of the visual cue based on their shapes. A fastener 86A may be received in the fastener openings 86, 88 to secure the circuit boards to the bottom wall 42 of the housing 39.

The spacer 72 may be assembled to the circuit board 74. That is, the lower tabs 92 may engage the circuit boards 74 at the engagement surfaces 94.

The circuit board 70 may be coupled to the spacer 72 by coupling the tabs 90 at the engagement grooves 84.

The tabs 62 of the alignment frame 54 engage the engagement grooves 84 in the circuit board 70 to retain the alignment frame 54 thereon.

Figure 10A:
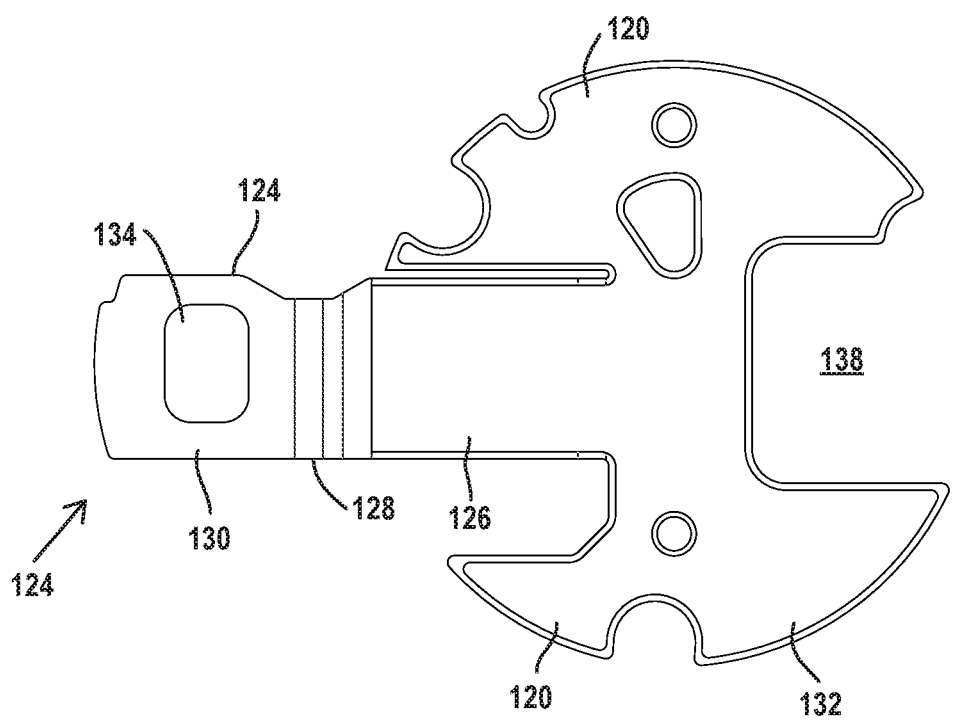
FIG. 10A is a top view of the flexible heat transfer element.
Figure 10B:
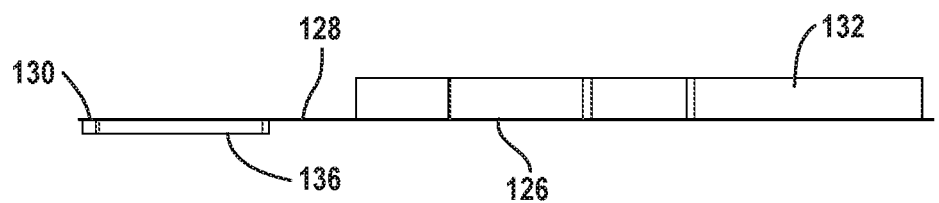
FIG. 10B is a side view of the flexible heat transfer element.
Figure 10C:
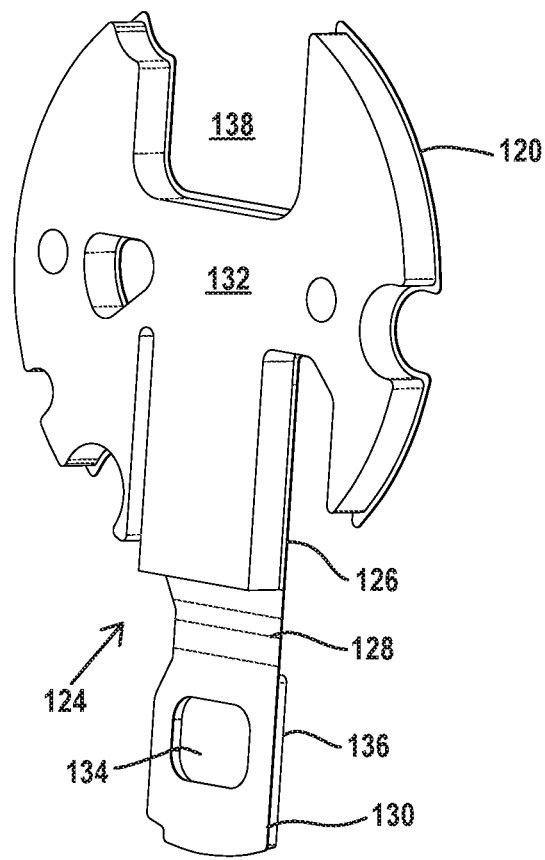
FIG. 10C is a perspective view of the heat transfer element.
Figure 10D:
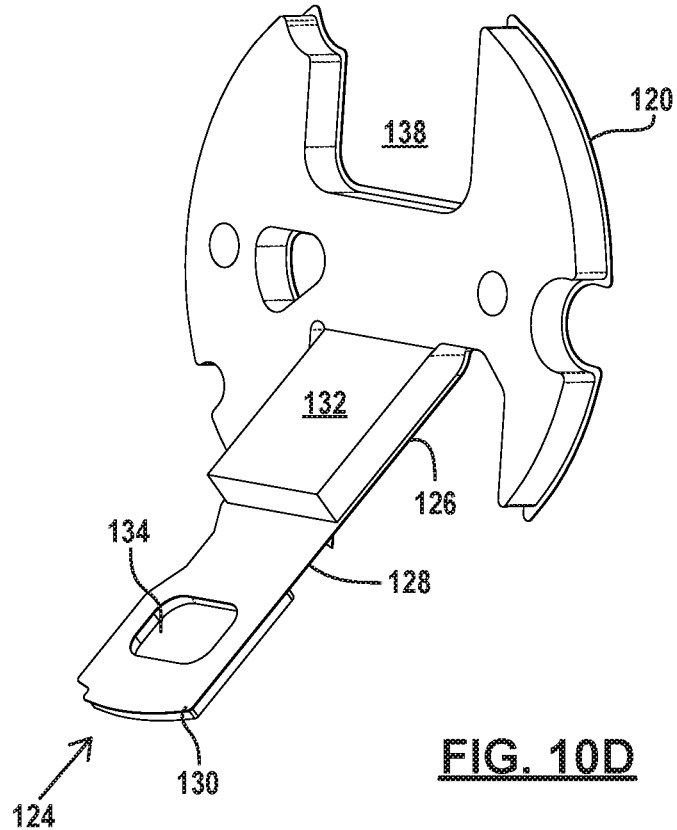
FIG. 10D is a perspective view of the tab portion partially folded of the heat transfer element.
Figure 10E:
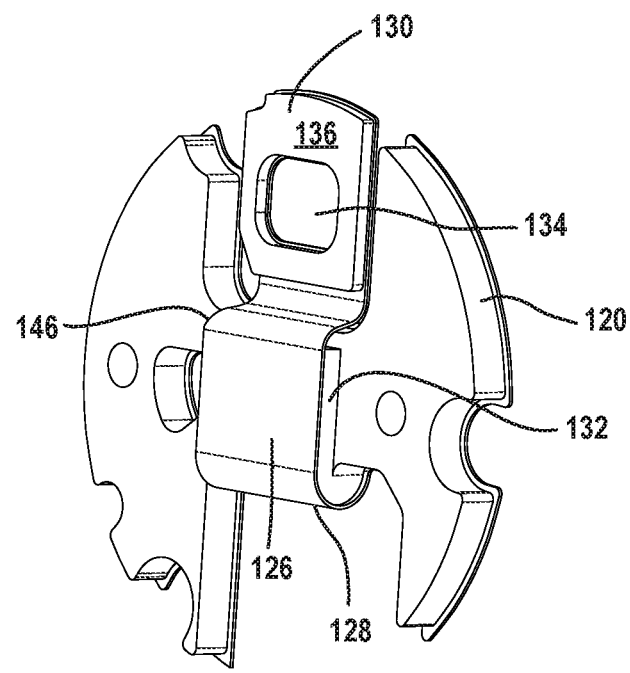
FIG. 10E is a perspective view of the heat transfer element completely folded as is assembled.

The flexible heat transfer element 120 is formed. Thereafter, the flexible heat transfer element is assembled into the housing 39 adjacent to the bottom wall 42. Because the tab portion 124 is flexible, the tab portion may flex as illustrated in FIG. 10D upon the insertion of the flexible heat transfer element 120. The bending portion 82 may then be bent so that the end portion 130 is disposed around the connector 38 and within the cutout 138. The conformable layer 132 at the central portion 126 is thus adjacent to the conductive foam on the first portion 122.

Figure 10F:
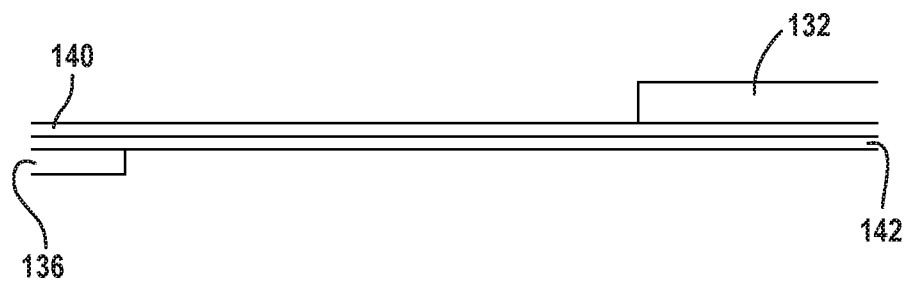
FIG. 10F is a cross-sectional view of the heat transfer element.

Referring now to FIG. 10F, a cross-sectional view of the flexible heat transfer element 120 is illustrated. As is shown, the conformable layer 132 is thermally conductive and is disposed on a graphite layer 140. The graphite layer 140 may have a polymer layer 142 to hold the tension at the outer surface of the bend. Conformable layer 136 is used to facilitate the conduction of heat from the lower circuit board.

When the system is assembled, the first portion 122 of the flexible heat transfer element 120 is disposed in a first plane parallel to the plane of the central portion 126 which has its orientation reversed at the bending portion 128. The graphite layer 140 is directly adjacent to the processor or other electrical component to have the heat removed. The end portion 130 is disposed in a plane directly below the plane of the circuit board 78. Thus, heat is removed from the processor 80 which is in a first plane and the heat is transferred below the circuit board 78 that is disposed in a second plane. Heat thus gets transferred to the housing 39 of the display assembly 26 which, in this example, is both the bottom wall 42 and the side wall 40.

The foregoing description of the examples has been provided for purposes of illustration and description. It is not intended to be exhaustive or to limit the disclosure. Individual elements or features of a particular example generally not limited to that particular example, but, where applicable, are interchangeable and can be used in a selected example, even if not specifically shown or described. The same may also be varied in many ways. Such variations are not to be regarded as a departure from the disclosure, and all such modifications are intended to be included within the scope of the disclosure.

What is claimed is:

1. A circuit assembly comprising:
    a plurality of circuit boards, each circuit board of the plurality of circuit boards comprising a plurality of pairs of engagement grooves spaced around a periphery of each circuit board, each pair of engagement grooves of said plurality of pairs of engagement grooves comprising a first groove and a second groove, said plurality of circuit boards comprising a first circuit board and a second circuit board;
    a plurality of spacers, each spacer of the plurality of spacers comprising a plurality of sets of alignment elements, each sets of alignment elements comprising a first tab extending in a first axial direction and a first tab receiver extending in the first axial direction having a first size for receiving a first portion of the first tab of another spacer, said plurality of sets of alignment elements further comprising a second tab extending in a second axial direction opposite the first axial direction and a second tab receiver extending in the second axial direction having a second size for receiving a first portion of the second tab of another spacer, said plurality of spacers comprising a first spacer and a second spacer;
    said first spacer of the plurality of spacers disposed between the first circuit board and second circuit board, wherein a first tab of the first spacer is disposed within a first engagement groove of the plurality of pairs of engagement grooves of the first circuit board;
    said second circuit board disposed between the first spacer and the second spacer of the plurality of spacers;
    wherein a second tab of the first spacer is received in a second engagement groove of the plurality of pairs of engagement grooves of the second circuit board and a first tab receiver of the second spacer; and
    wherein a third tab of the second spacer is received in a third engagement groove of the second circuit board and at least partially within a second tab receiver of the first spacer.

2. The circuit assembly as recited in claim 1 wherein the first tab is axially aligned with the second tab receiver and wherein the second tab is axially aligned with the first tab receiver.

3. The circuit assembly as recited in claim 1 wherein the second tab comprises a first engagement surface engaging the second circuit board and wherein the third tab comprises a second engagement surface engaging the second circuit board.

4. The circuit assembly as recited in claim 1 wherein the plurality of spacers are rotationally symmetric.

5. The circuit assembly as recited in claim 1 wherein the plurality of circuit boards are round and the plurality of pairs of engagement grooves are equally spaced.

6. The circuit assembly as recited in claim 1 wherein the plurality of spacers are bi-orientable.

7. The circuit assembly as recited in claim 1 wherein the plurality of spacers comprise a first fastener opening in the plurality of sets of alignment elements.

8. The circuit assembly as recited in claim 7 wherein the first fastener opening is disposed between the first tab and the second tab.

9. The circuit assembly as recited in claim 8 wherein the plurality of circuit boards comprises a second fastener opening, aligned with the first fastener opening.

10. The circuit assembly as recited in claim 1 wherein the first spacer comprising an outer wall comprising electrically shielding material.

11. The circuit assembly as recited in claim 10 wherein the first spacer comprises a cover comprising electrically shield material extending at least partially within the outer wall.

12. The circuit assembly as recited in claim 1 wherein the first circuit board is coupled to an alignment frame and a global positioning antenna disposed directly adjacent to the alignment frame and a glass cover.

* * * * *